(12) United States Patent
Song

(10) Patent No.: US 6,649,998 B2
(45) Date of Patent: Nov. 18, 2003

(54) PASSIVE DEVICES AND MODULES FOR TRANSCEIVER

(75) Inventor: Insang Song, Seoul (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/171,756

(22) Filed: Jun. 17, 2002

(65) Prior Publication Data

US 2002/0192920 A1 Dec. 19, 2002

(30) Foreign Application Priority Data

Jun. 15, 2001 (KR) ........................................ 2001-33911

(51) Int. Cl.[7] .............................................. H01L 29/00
(52) U.S. Cl. ...................................... 257/532; 257/531
(58) Field of Search ................................ 257/295–310, 257/530–536; 438/253–254

(56) References Cited

U.S. PATENT DOCUMENTS

| 5,541,442 A | * | 7/1996 | Keil et al. ................... 257/533 |
| 5,608,263 A | | 3/1997 | Drayton et al. |
| 5,874,770 A | * | 2/1999 | Saia et al. ................... 257/536 |
| 5,915,168 A | | 6/1999 | Salatino et al. |
| 6,294,834 B1 | * | 9/2001 | Yeh et al. .................... 257/356 |

FOREIGN PATENT DOCUMENTS

| EP | 0851492 A2 | 7/1998 |
| EP | 0969509 A1 | 1/2000 |

* cited by examiner

Primary Examiner—Cuong Quang Nguyen
(74) Attorney, Agent, or Firm—Burns, Doane, Swecker & Mathis, LLP

(57) ABSTRACT

A passive device and module for a transceiver, and a manufacturing method thereof are provided. The passive device includes a semiconductor or a dielectric substrate, at least one capacitor, at least one inductor, a viahole, a metal electrode, radio frequency signals, a radio frequency ground, a packaging substrate. The at least one capacitor is formed on a first surface of the substrate. The at least one inductor is formed on a second surface of the substrate that is opposite to the first surface. The viahole penetrates through the substrate. The metal electrode is formed on the viahole and electrically connects the capacitor on the first surface and the inductor on the second surface. Radio frequency signals are for the inductor and the capacitor. The radio frequency ground is formed on the substrate and isolated from the radio frequency signals. The packaging substrate is bonded on the first surface or the second surface of the substrate, having a cavity covering a structure on the bonded surface of the substrate. A reduction in the area required for mounting passive devices and modules thereof contributes to the downsizing of communication systems. Also, use of MEMS technique can reduce insertion loss of inductors, which improves the communication quality of the communication systems.

18 Claims, 8 Drawing Sheets

PASSIVE DEVICES AND MODULES FOR TRANSCEIVER

Priority is claimed to Patent Application Number 2001-33911 filed in Rep. of Korea on Jun. 15, 2001, herein incorporated by reference.

BACKGROUND OF THE INVENTION

1. Field of the Invention

The present invention relates to passive devices and modules for a transceiver, and a manufacturing method thereof, and more particularly, to passive devices and modules for a transceiver in which capacitors, inductors and etc. are formed on and under a substrate, respectively, using a Micro Electro Mechanical System (MEMS) technique, and connected to each other to form a circuit, and a manufacturing method thereof.

2. Description of the Related Art

With the improvement of radio communication techniques, techniques for improving the communication quality of mobile communication systems and downsizing the mobile communication systems have been developed. Also, a transmitting and receiving method for the radio communication systems has been developed with the separate use of frequencies in several bandwidths such as in code division multiple access (CDMA) mode using frequencies in a bandwidth of 900 MHz, and personal communication system (PCS) mode using frequencies in a bandwidth of 1.8 GHz and etc. Therefore, the downsizing of the radio communication systems is more required with use of transceivers using multi-bands.

To downsize personal mobile communication systems, it is most important to reduce the sizes of passive devices, which take up the most space in personal mobile communication systems. Since passive devices used in general mobile communication systems are mostly discrete devices and take up a lot of space on a substrate, they increase the area required for chip mounting and the manufacturing cost. In particular, inductors take up a great deal of space and degrade communication quality.

SUMMARY OF THE INVENTION

To solve the above-described problems, it is a first object of the present invention to provide passive devices and modules for a transceiver which are integrated on and under a substrate using a MEMS technique.

It is a second object of the present invention to provide a method of manufacturing the passive devices and the modules.

Accordingly, to achieve the first object, there is a passive device for a transceiver. The passive device includes a semiconductor substrate or a dielectric substrate, at least one capacitor, at least one inductor, a viahole, a metal electrode, radio frequency signals, a radio frequency ground, and a packaging substrate. The at least one capacitor is formed on a first surface of the substrate. The at least one inductor is formed on a second surface of the substrate that is opposite to the first surface. The viahole penetrates through the substrate. The metal electrode is formed on the viahole and electrically connects the capacitor on the first surface and the inductor on the second surface. Radio frequency signals are for the inductor and the capacitor. The radio frequency ground is formed on the substrate and isolated from the radio frequency signals. The packaging substrate is bonded on the first surface or the second surface of the substrate, having a cavity covering a structure on the bonded surface of the substrate.

To achieve the second object, there is provided an integrated module for a transceiver. The integrated module includes a semiconductor substrate or a dielectric substrate, capacitors, inductors, viaholes, metal electrodes, radio frequency input and output signals, radio frequency grounds, and a packaging substrate. The capacitors are formed on a first surface of the substrate. The inductors are formed on a second surface of the substrate that is opposite to the first surface. The viaholes penetrate through the substrate. The metal electrodes are formed on the viaholes and electrically connect the capacitors on the first surface and the inductors on the second surface. The radio frequency input and output signals are for the inductors and the capacitors. The radio frequency grounds are formed on the substrate and isolated from the radio frequency input signals. The packaging substrate is bonded on the first surface or the second surface of the substrate, having a cavity covering a structure on the bonded surface of the substrate, Here, a circuit is formed of the capacitors, the inductors, the viaholes, the metal electrodes, and the radio frequency input and output signal lines. The circuit includes a radio frequency selector, duplexers, transmission band-pass filters, and reception band-pass filters. The radio frequency selector is composed of a high-pass filter and a low-pass filter. The duplexers include transmission filters that transmit a signal to the radio frequency selector and are composed of band-pass filters, and reception filters that receive a signal from the radio frequency selector and are composed of band-pass filters. The transmission band-pass filters transmit a signal to the transmission filters via power amplifiers. The reception band-pass filters receive a signal from the reception filters via low noise amplifiers.

To achieve the first and second objects, there is provided a method of manufacturing a passive device and a module for a transceiver. A second surface of a substrate is patterned to form a well for a viahole having a bottom. An inductor is formed on the second surface of the substrate and an electrode is formed on the inner wall and bottom of the well for the viahole. A first surface of a packaging substrate is etched. The first surface of the packaging substrate is bonded to the second surface of the substrate. The first surface of the packaging substrate that is opposite to the second surface of the substrate is cut and flattened to expose a portion of the electrode formed on the bottom of the well for the viahole. An integrated circuit including the capacitor is formed on the first surface of the substrate.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1A:
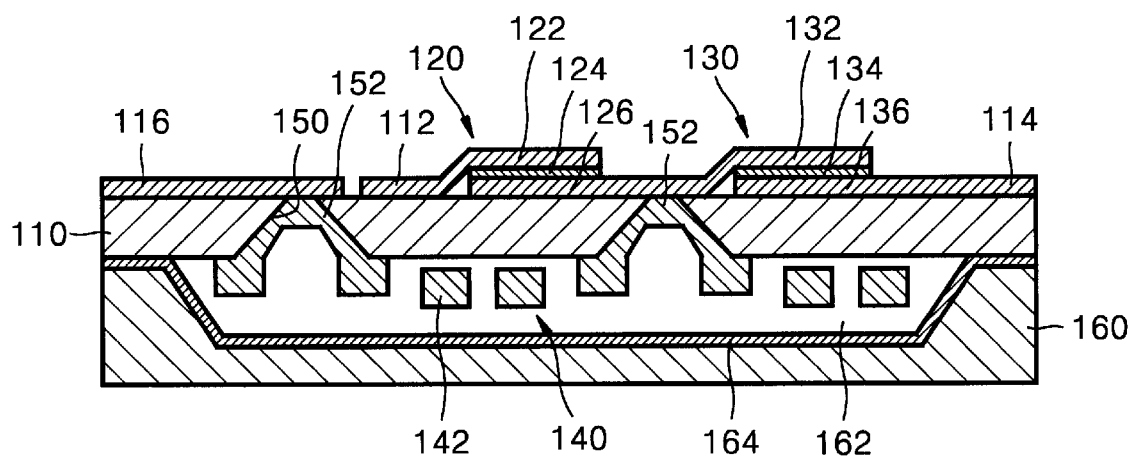
FIGS. 1A and 1B are a schematic cross-sectional view and a partial perspective view of a high-pass filter that is a passive device for a transceiver according to a first embodiment of the present invention.
Figure 1B:
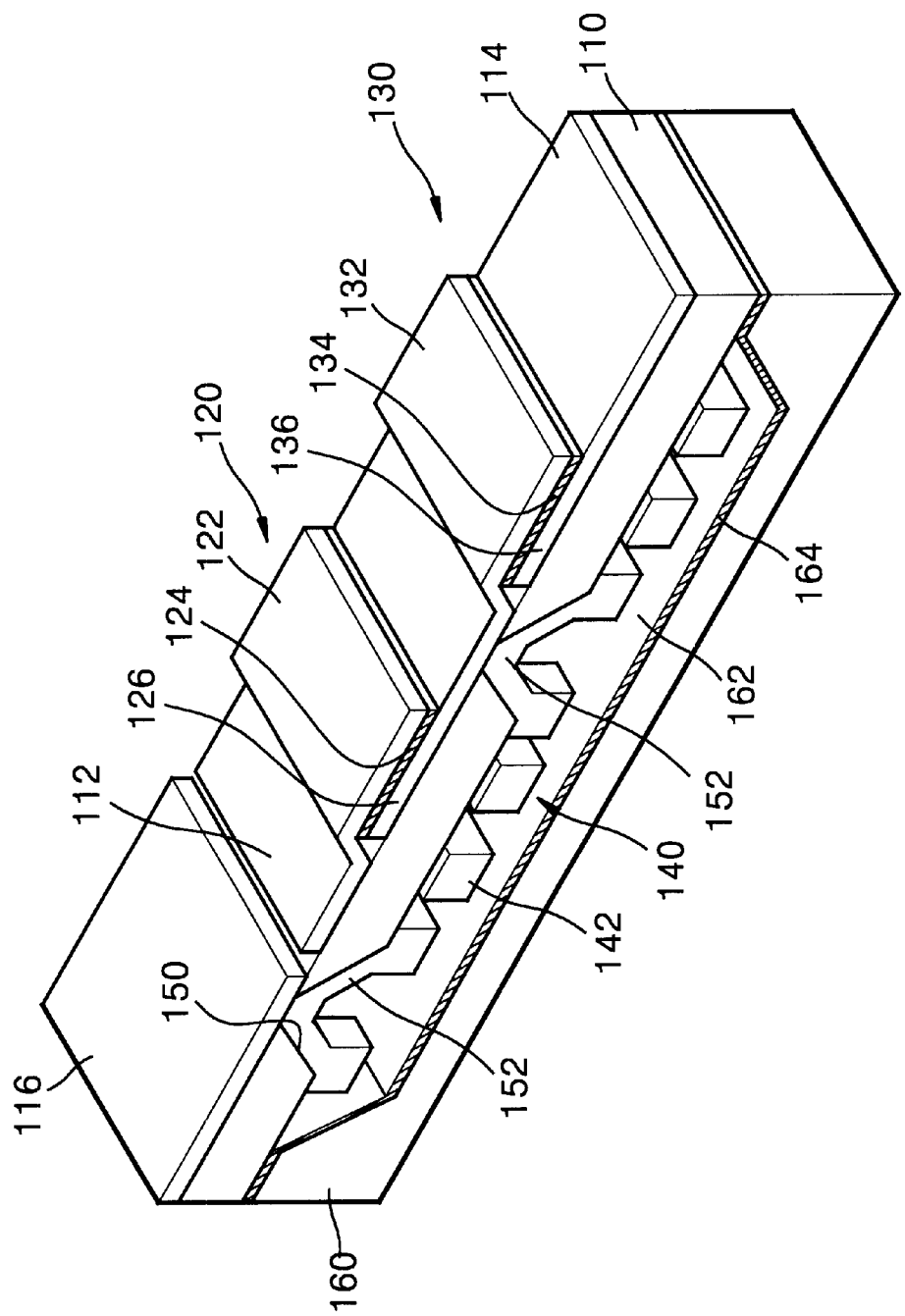
Figure 2:
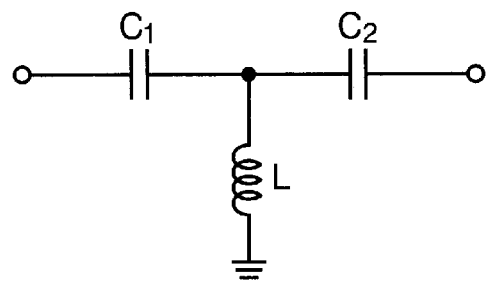
FIG. 2 is an equivalent circuit diagram of the high-pass filter shown in FIGS. 1A and 1B.

FIGS. 1A and 1B are a schematic cross-sectional view and a partial perspective view of a high-pass filter (HPF) that is a passive device for a transceiver according to a first embodiment of the present invention. FIG. 2 is an equivalent circuit diagram of the HPF shown in FIGS. 1A and 1B. As shown in FIG. 2, the HPF has a basic circuit configuration in which one inductor L is connected in parallel between two capacitors C1 and C2 that are connected in series to each other. FIGS. 1A and 1B show that the HPF having this equivalent circuit configuration is stacked on a substrate 110. A first capacitor 120 and a second capacitor 130 are connected in series to each other on the substrate 110, and an inductor 140 is formed under the substrate 110. The inductor 140 is connected to a connection between the first and second capacitors 120 and 130 on the substrate 110 via an electrode 152 that is formed on a viahole 150. A packaging substrate 160, in which a cavity 162 for containing the inductor 140 is formed, is coupled to the understructure of the substrate 110. A shielding metal 164 is formed on the surface of the cavity 162. The substrate 110 and the packaging substrate 160 are formed of a semiconductor or a dielectric. The packaging substrate 160 may be coupled on the substrate 10 so that it shields the capacitor 120 and 130 on the substrate 110.

The inductor 140 is manufactured by the MEMS technique. An electric conductor 142 of the inductor 140 floats apart from the substrate 110. The electric conductor 142 may be a dielectric (not shown) that is formed in a predetermined area corresponding to the electric conductor 142 and an air gap or a dielectric may be further formed on the electric conductor 142.

The first capacitor 120 is composed of a second electrode 126 that is a lower electrode formed on the substrate 110, a first electrode 122 that is an upper electrode opposite to the second electrode 126, and a first dielectric 124 that is interposed between the first and second electrodes 122 and 126. The second capacitor 130 is composed of an upper electrode 132 that is formed by extending the second electrode 126, a third electrode 136 that is a lower electrode, and a second dielectric 134 that is interposed between the upper electrode 132 and the third electrode 136. An end of the first electrode 122 is connected to an input signal line 112, an end of the third electrode 136 is connected to an output signal line 114, and a ground 116 is formed beside the input and output signal lines 112 and 114 to transmit radio frequency (RF) signals of the input and output signal lines 112 and 114.

In the HPF having the above-described structure, if a signal having a predetermined frequency is input from the input signal line 112, the predetermined frequency signal is transmitted through the first and second capacitors 120 and 130 to the output signal line 114. A signal below a predetermined frequency is output through the inductor 140 to the ground 116.

Figure 3:
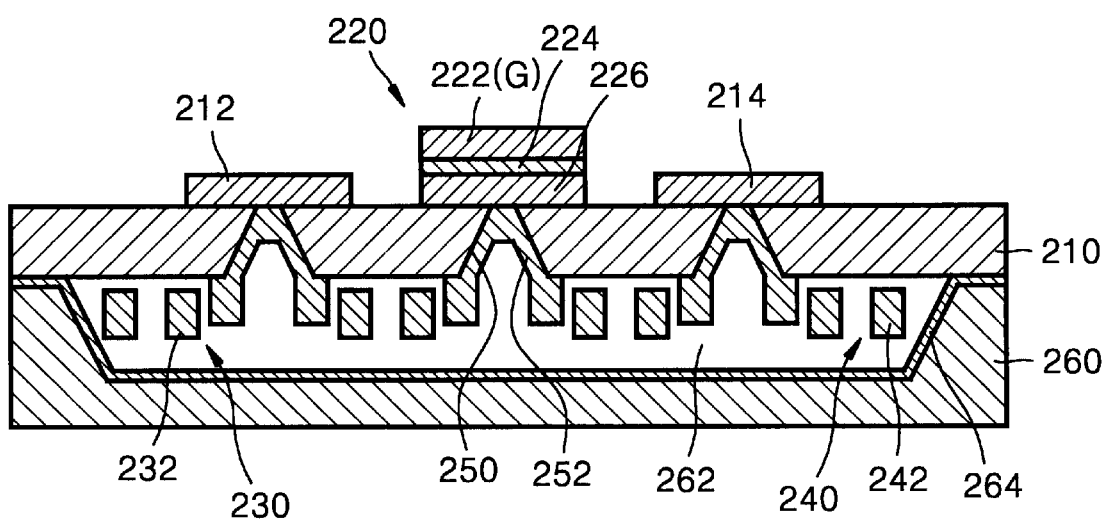
FIG. 3 is a schematic cross-sectional view of a low-pass filter that is a passive device for a transceiver according to a second embodiment of the present invention.
Figure 4:
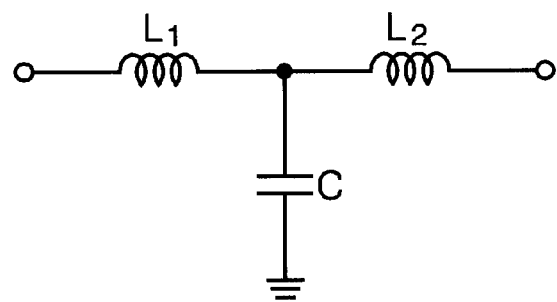
FIG. 4 is an equivalent circuit diagram of the low-pass filter shown in FIG. 3.

FIG. 3 is a schematic cross-sectional view of a low-pass filter (LPF) that is a passive device for a transceiver according to a second embodiment of the present invention. FIG. 4 is an equivalent circuit diagram of the LPF shown in FIG. 3. As shown in FIG. 4, the LPF has a basic circuit configuration in which one capacitor C is connected in parallel between two inductors L1 and L2. FIG. 3 shows that the LPF having this equivalent circuit configuration is stacked on a substrate 210. First and second inductors 230 and 240 are connected in series to each other under the substrate 210. A capacitor 220 is formed on the substrate 210. The capacitor 220 is connected to a connection between the first and second inductors 230 and 240 under the substrate 210 via an electrode 252 that is formed on a viahole 250. A packaging substrate 260 in which a cavity 262 for containing the first and second inductors 230 and 240 is formed is coupled to the understructure of the substrate 210. A shielding metal 264 is formed on the surface of the cavity 262. The substrate 210 and the packaging substrate 260 are formed of a semiconductor or a dielectric. The packaging substrate 260 may be coupled on the substrate 260 so that it shields the capacitor 220 on the substrate 210.

The inductors 230 and 240 are manufactured by the MEMS technique. Electric conductors 232 and 242 of the inductors 230 and 240 float apart from the substrate 210. Electric conductors 232 and 242 may be formed on a dielectric (not shown) that is formed in a predetermined area corresponding to the electric conductor 232 and 242 and an air gap or a dielectric may be further formed on the electric conductors 232 and 242.

The capacitor 220 is composed of a lower electrode 226 that is formed on the substrate 210, an upper electrode 222 that is opposite to the lower electrode 226, and a dielectric 224 that is interposed between the lower and upper electrodes 226 and 222.

In the LPF having the above-described structure, if a signal having a predetermined frequency is input from an input signal line 212 that is connected to an end of the first inductor 230, the signal is transmitted through the first and second inductors 230 and 240 to an output signal line 214 that is connected to the other end of the second inductor 240. A signal above a predetermined frequency is output through the capacitor 220 to a ground G that is connected to the upper electrode 222.

Figure 5:
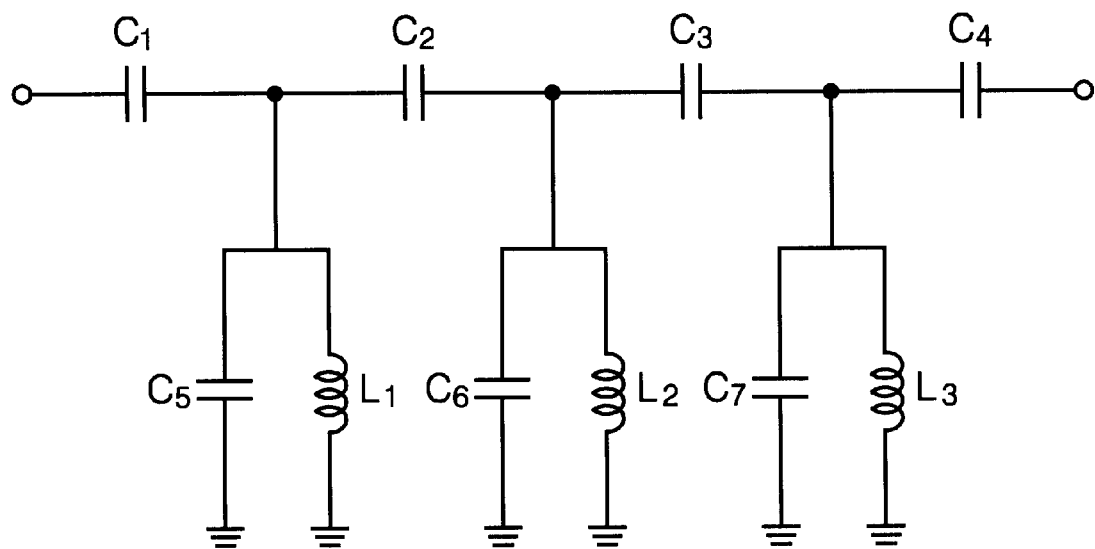
FIG. 5 is an equivalent circuit diagram of a band-pass filter that is a passive device for a transceiver according to a third embodiment of the present invention.

FIG. 5 is an equivalent circuit diagram of a band-bass filter (BPF) that is a passive device for a transceiver according to a third embodiment of the present invention. Referring to FIG. 5, a plurality of capacitors C1, C2, C33 and C4 are connected in series to each other. Other capacitors C5, C6, and C7 and inductors L1, L2, and L3 are connected in parallel to each other between the capacitors C1, C2, C3, and C4. To stack this equivalent circuit on one substrate, the capacitor C1, C2, C3, C4, C5, C6, and C7 are formed on a substrate and the inductors L1, L2, and L3 that are connected to the capacitors C1, C2, C3, C4, C5, C6, and C7 are formed under the substrate. Here, the inductors L1, L2, and L3 are connected to the capacitors C1, C2, C3, C4, C5, C6, and C7 via an electrode (152 of FIGS. 1A and 1B or 252 of FIG. 3) formed on a viahole. A packaging substrate, in which a cavity for containing the inductors L1, L2, and L3 is formed and a shielding metal is formed on the surface of the cavity, is coupled to the understructure of the substrate. The substrate and the packaging substrate are formed of a semiconductor or a dielectric.

The inductors L1, L2, and L3 are manufactured by the MEMS technique. Electric conductors of the L1, L2, and L3 float apart from the substrate. The electric conductors of L1, L2, and L3 may be formed on a dielectric (not shown) that is formed on the substrate. Air gaps or dielectrics may be formed on the electric conductors.

In the BPF having the above-described structure, a signal having a predetermined frequency is input to an end of the first capacitor C1, the signal is filtered through circuits of the capacitors C1, C2, C3, C4, C5, C6, and C7 and the inductors L1, L2, and L3 and transmitted to an output signal line at the other end of the capacitor C4.

Figure 6:
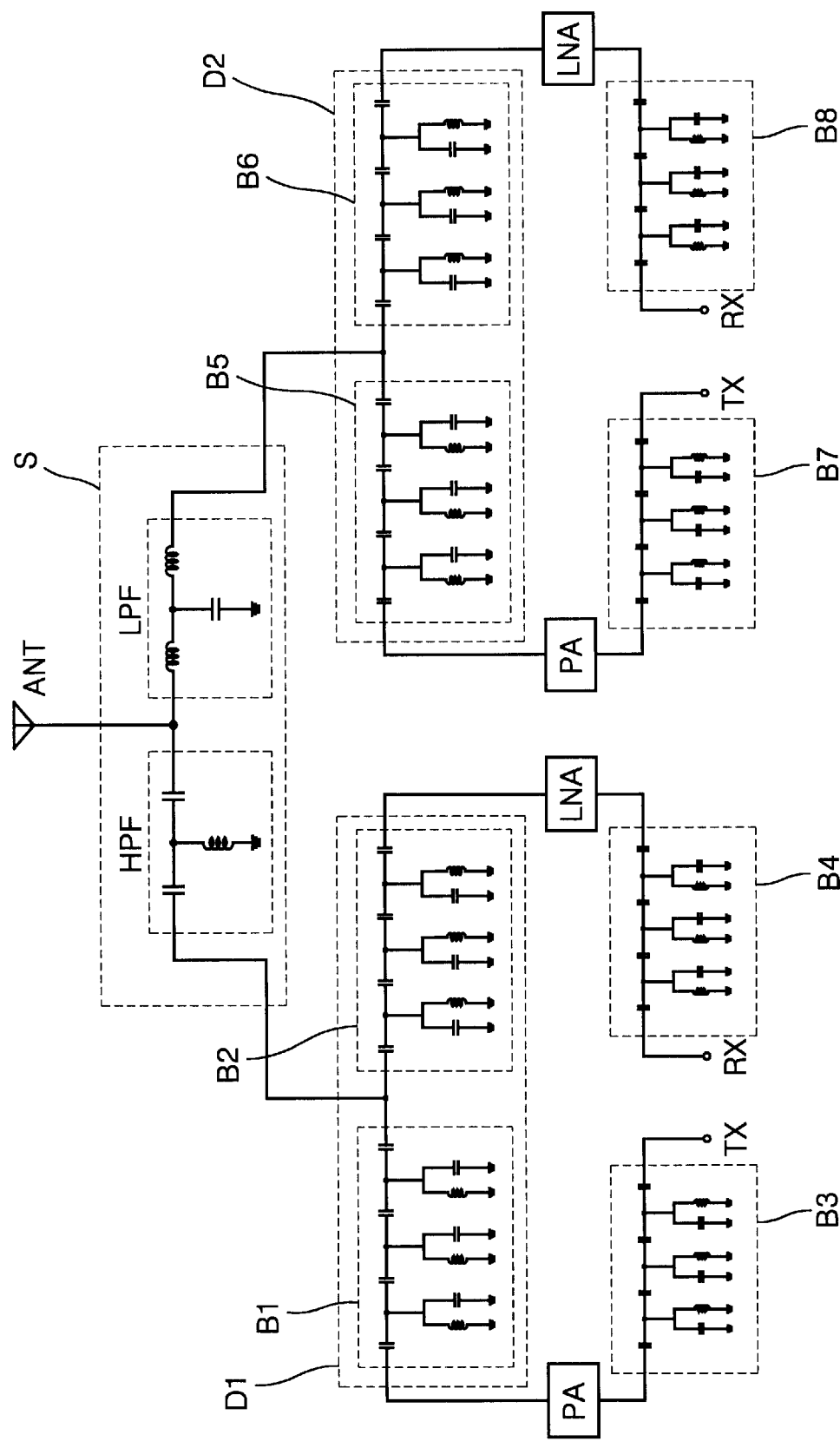
FIG. 6 is an equivalent circuit diagram of an integrated module that is a passive device for a transceiver according to a fourth embodiment of the present invention.

FIG. 6 is an equivalent circuit diagram of an integrated module that is a passive device for a transceiver according to a fourth embodiment of the present invention. Here, the integrated module is usable in a double frequency bandwidth which consists of a PCS mode using a transmission and reception frequency in a bandwidth of a 1.8 GHz and a CDMA mode using a transmission and reception frequency in a bandwidth of 0.9 GHz. Referring to FIG. 6, the integrated module that is a passive device for a transceiver is composed of a radio frequency (RF) selector S, duplexers D1 and D2, transmission band-pass filters B3 and B7, and reception band-pass filters B4 and B8. The RF selector S identifies a frequency signal from a transmission and reception antenna ANT. Duplexers D1 and D2 receive and switch a signal received from the transmission and reception antenna ANT and a signal that will be transmitted to the transmission and reception antenna ANT. Transmission band-pass filters B3 and B7 filter a signal that will be transmitted to the duplexers D1 and D2. Reception band-pass filters B4 and B8 filter a signal received from the duplexers D1 and D3.

The RF selector S includes a HPF and a LPF which are the same as those described in the first and second embodiments, respectively. The duplexers D1 and D2 include transmission filters B1 and B5 and reception filters B2 and B6, respectively, which are composed of band-pass filters described in the third embodiment.

To stack the equivalent circuit shown in FIG. 6 on a substrate, a plurality of capacitors are connectedly formed on the substrate as previously described. Inductors, which are formed under the substrate, are connected to the capacitors via an electrode formed on a viahole. Thus, the connection between the passive devices is realized by the MEMS technique through a substrate. The integrated module having the above-described structure serves as a radio transceiver connected to an external integrated circuit (IC) including a converter between an audio signal and an electric circuit, a modulator for modulating a low frequency signal into a high frequency signal, and an amplifier.

The operation of the integrated module for a transceiver having the above-described structure will be described in detail with reference to FIG. 6. First, a process of transmitting a signal will be described. Transmission nodes Tx transmit a signal, the transmission band-pass filter B3 and B7 filter the signal, power amplifiers (PAs) amplify the signal, the transmission filters B1 and B5 of the duplexers D1 and D2 filter the signal, the HPF or LPF transmits the signal to the transmission and reception antenna ANT and then to the outside.

Next, a process of receiving a signal will be described. A signal received from the transmission and reception antenna ANT selects its reception path in the RF selector S based on frequency. The reception filters B2 and B6 of the duplexers D1 and D2 filter the signal and low noise amplifiers (LNAs) amplify the signal. The transmission band-pass filters B4 and B8 filter the signal and output the signal to reception nodes Rx.

Figure 7:
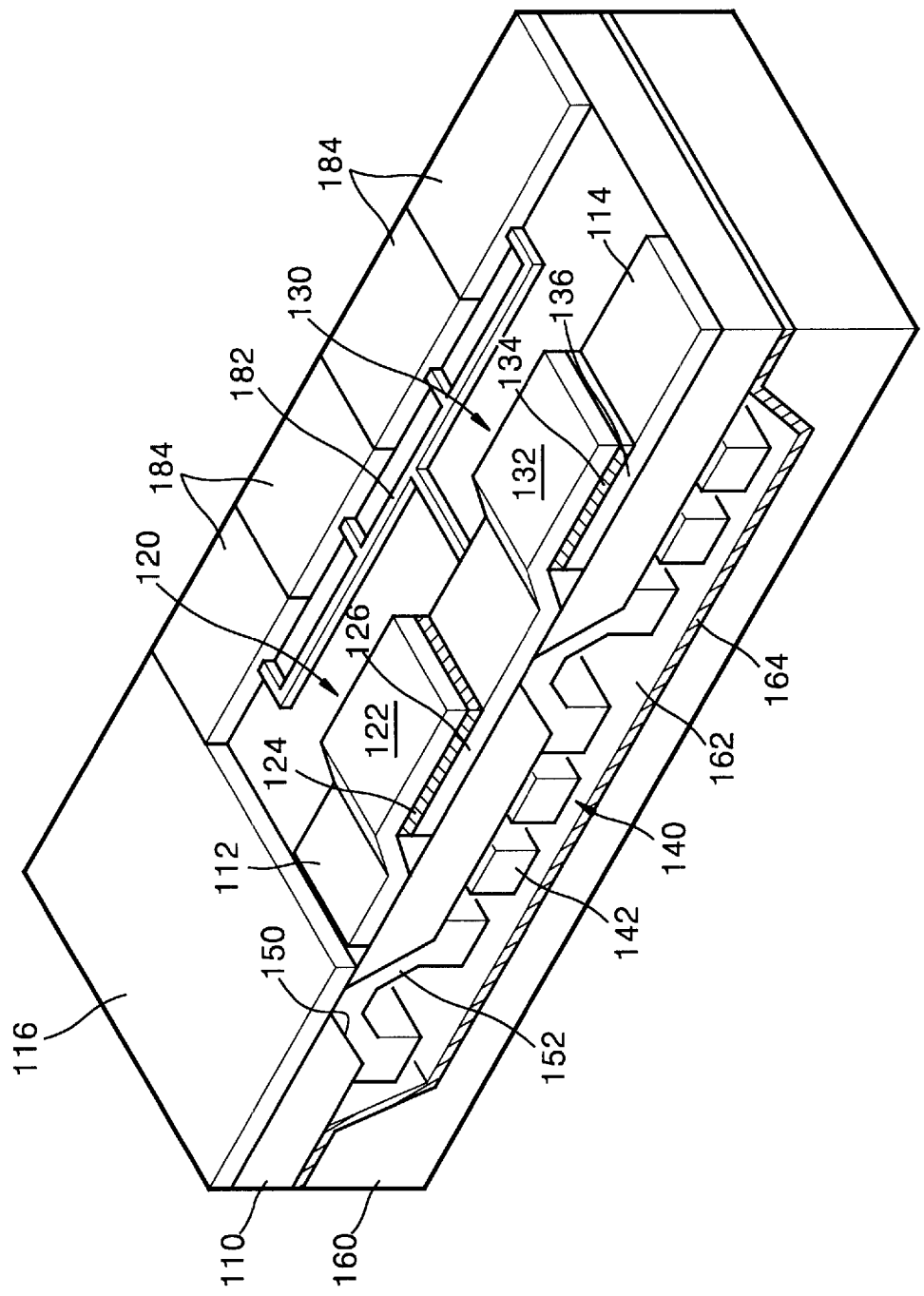
FIG. 7 is a perspective view explaining the integrated module according to the fourth embodiment of the present invention.

FIG. 7 shows that a RF IC is prepared on a substrate of the HPF of FIG. 1B to describe the fourth embodiment of the present invention in detail. Like reference numerals in the fourth embodiment denote the same members in the first embodiment and their detailed description will be omitted. Referring to FIG. 7, capacitors 120 and 130 are formed on a substrate 110. RF ICs 184 are connected to a signal line 182 that is connected to a connection between the capacitors 120 and 130. The RF IC 184 may be an oscillator, a mixer, a LNA or a driver amplifier, and is composed of resistor(s), capacitor(s), and inductor(s). The RF IC 184 may be a general discrete device or may be a general discrete circuit in which at least one capacitor (not shown) is formed on the substrate 110, at least one inductor (not shown) is formed under the substrate 110, and an electrode formed on a viahole connects the capacitor to the inductor by the method of the previous embodiments.

Figure 8A:
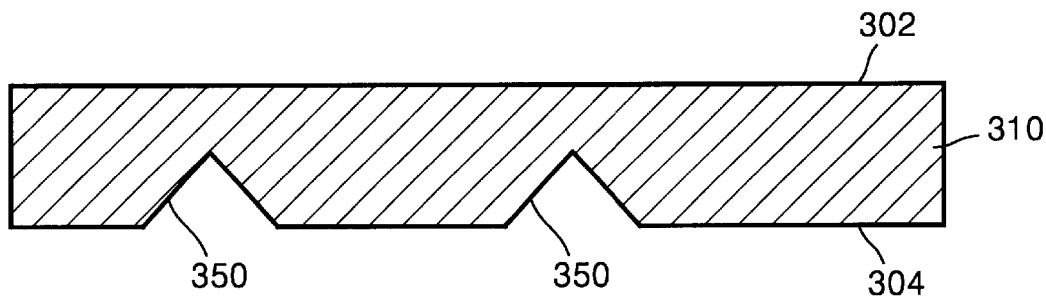
FIGS. 8A through 8E are cross-sectional views explaining a method of manufacturing the passive devices and modules for a transceiver of the present invention shown in FIGS. 1A and 1B.
Figure 8B:
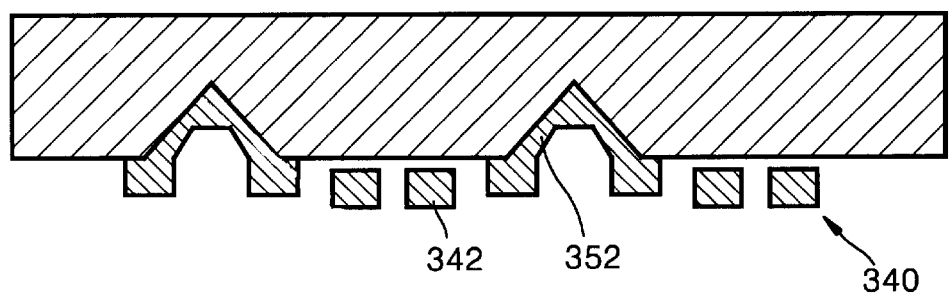

A method of manufacturing HPF will be described with reference to FIGS. 8A through 8E to explain the method of manufacturing passive devices and modules for a transceiver of the present invention. As shown in FIG. 8A, a second surface 304 of a substrate 300 is patterned to form a well 350 for a viahole having a bottom. As shown in FIG. 8B, an inductor 340 is formed on the second surface 304 using the MEMS technique. An electrode 352 is formed on the inner wall and bottom of the well 351 for the viahole. Here, a sacrificial layer (not shown) is formed so that an electric conductor 342 of the inductor 340 is formed so as to float apart from the second surface 304 of the substrate 310. The sacrificial layer is removed.

A dielectric (not shown) may be formed in a predetermined area on the second surface 304 of the substrate 310 that is opposite to the electric conductor 342 of the inductor 340. The electric conductor 342 is formed on the dielectric. An air gap or a dielectric may be formed on the electric conductor 342.

Figure 8C:
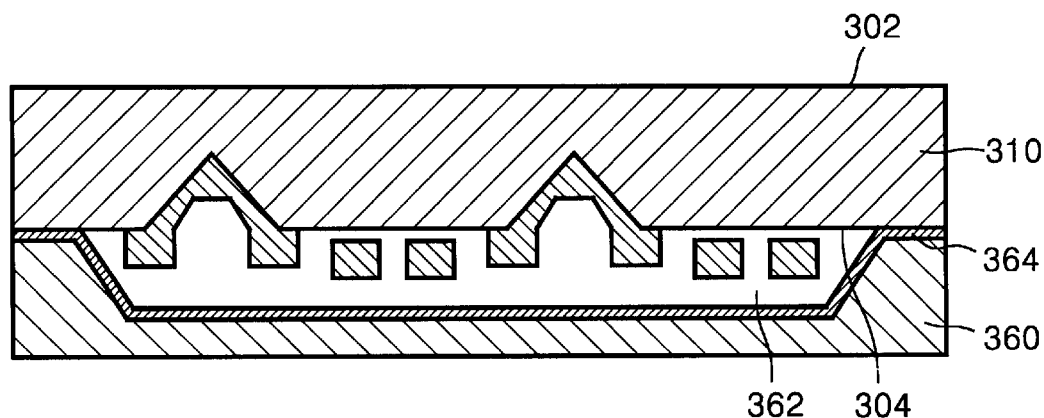

A separate packaging substrate 360 is etched to form a cavity 362 which will contain the inductor 340 inside. As shown in FIG. 8C, a shielding metal 364 is formed on the packaging substrate 360 and the packaging substrate 360 is bonded to the second surface 304 of the substrate 310.

Figure 8D:
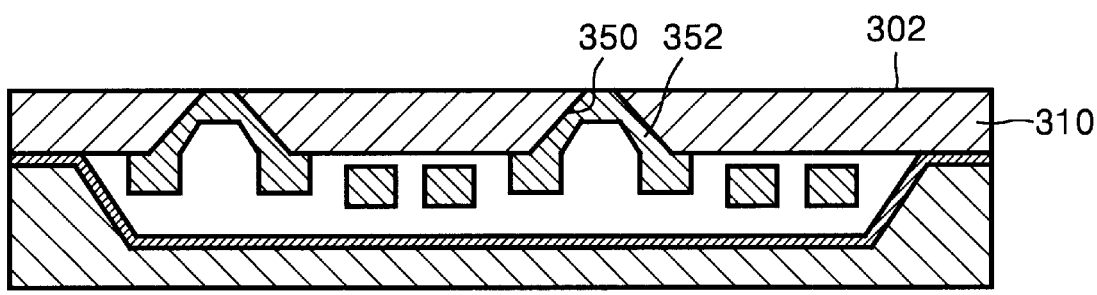

A first surface 302 of the substrate 310 is cut and flattened using a lapping machine (not shown) so that a portion of the electrode 352 on the bottom of the well 350 is exposed on the first surface 302 of the substrate 310 (See FIG. 8D). This flattening process can easily control the size of the viahole 350 that is exposed on the first surface 302 of the substrate 310.

Figure 8E:
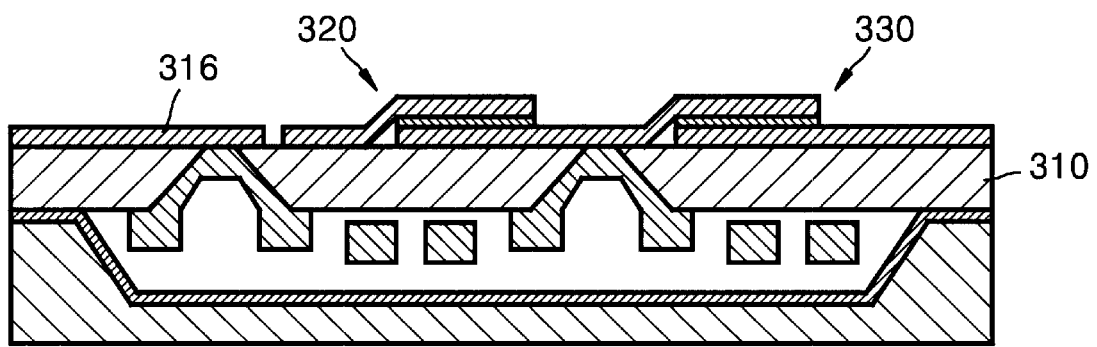

As shown in FIG. 8E, an integrated circuit including capacitors 320 and 330 is formed on the first surface 302 of the substrate 310.

The above-described manufacturing method can be extended and applied to manufacture passive devices and modules for a transceiver.

As described above, a reduction in the area required for mounting passive devices and modules thereof according to the present invention contributes to the downsizing of communication systems. Also, use of MEMS technique can reduce insertion loss of inductors, which improves the communication quality of the communication systems. Further, it is easy to form a viahole and control the size of the viahole.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A passive device for a transceiver comprising:
   one of a semiconductor substrate and a dielectric substrate;
   at least one capacitor which is formed on a first surface of the substrate;
   at least one inductor which is formed on a second surface of the substrate that is opposite to the first surface;
   a viahole which penetrates through the substrate;
   a metal electrode which is formed on the viahole and electrically connects the capacitor on the first surface and the inductor on the second surface;
   radio frequency signals for the inductor and the capacitor;
   a radio frequency ground which is formed on the substrate and isolated from the radio frequency signals; and
   a packaging substrate which is bonded on the first surface or the second surface of the substrate, having a cavity covering a structure on the bonded surface of the substrate.

2. The passive device for a transceiver of claim 1, wherein the inductor floats apart from the substrate or is formed on a dielectric that is formed on the substrate.

3. The passive device for a transceiver of claim 2, further comprising one of an air gap and a dielectric that is formed on the inductor.

4. The passive device for a transceiver of claim 1, wherein the packaging substrate is one of a semiconductor substrate and a dielectric substrate.

5. The passive device for a transceiver of claim 1, wherein a shielding metal is formed on the surface of the cavity.

6. The passive device for a transceiver of claim 1, wherein a high-pass filter is formed of two capacitors and one inductor and the inductor is connected in parallel to the capacitors via the viahole.

7. The passive device for a transceiver of claim 1, wherein a low-pass filter is formed of one capacitor and two inductors and the capacitor is connected in parallel to the inductors via the viahole.

8. The passive device for a transceiver of claim 1, wherein a band-pass filter is formed of a plurality of capacitors that are connected in series to each other, capacitors that are connected in parallel between the capacitors connected in series, and inductors that are connected in parallel between the capacitors that are connected in parallel via the viaholes.

9. An integrated module for a transceiver comprising:
   one of a semiconductor substrate and a dielectric substrate;
   capacitors which are formed on a first surface of the substrate;
   inductors which are formed on a second surface of the substrate that is opposite to the first surface;
   viaholes which penetrate through the substrate;
   metal electrodes which are formed on the viaholes and electrically connect the capacitors on the first surface and the inductors on the second surface;
   radio frequency input and output signals for the inductors and the capacitors;
   radio frequency grounds which are formed on the substrate and isolated from the radio frequency input signals;
   a packaging substrate which is bonded on the first surface or the second surface of the substrate, having a cavity covering a structure on the bonded surface of the substrate,
   wherein a circuit is formed of the capacitors, the inductors, the viaholes, the metal electrodes, and the radio frequency input and output signal lines, the circuit comprising:
      a radio frequency selector which is composed of a high-pass filter and a low-pass filter;
      duplexers which include transmission filters that transmit a signal to the radio frequency selector and are composed of band-pass filters, and reception filters that receive a signal from the radio frequency selector and are composed of band-pass filters;
      transmission band-pass filters which transmit a signal to the transmission filters via power amplifiers; and
      reception band-pass filters which receive a signal from the reception filters via low noise amplifiers.

10. The integrated module for a transceiver of claim 9, further comprising at least one radio frequency integrated circuit which is connected to the capacitors on the first surface of the substrate.

11. The integrated module for a transceiver of claim 10, wherein the radio frequency integrated circuit is one of a discrete device and a circuit which is composed of at least one capacitor that is formed on the first surface of the substrate, at least one inductor that is formed on the second surface of the substrate, an electrode that is formed on a viahole and electrically connects the capacitor and the inductor.

12. The integrated module for a transceiver of claim 9, wherein the inductor floats apart from the substrate or is formed on a dielectric that is formed on the substrate.

13. The integrated module for a transceiver of claim 12, further comprising one of an air gap and a dielectric that is formed on the inductor.

14. The integrated module for a transceiver of claim 9, wherein the packaging substrate is one of a semiconductor substrate and a dielectric substrate.

15. The integrated module for a transceiver of claim 9, wherein a shielding metal is formed on the surface of the cavity.

16. The integrated module for a transceiver of claim 9, wherein the high-pass filter comprises two capacitors and one inductor and the inductor is connected in parallel to the capacitors via the viahole.

17. The integrated module for a transceiver of claim 9, wherein the low-pass filter comprises one capacitor and two inductors and the capacitor is connected in parallel to the inductors via the viahole.

18. The integrated module for a transceiver of claim 9, wherein the band-pass filter comprises a plurality of capacitors that are connected in series to each other, capacitors that are connected in parallel between the plurality of capacitors connected in series, and inductors that are connected in parallel between capacitors that are connected in parallel via the vial holes.

* * * * *